(12) United States Patent
Lin

(10) Patent No.: US 6,518,200 B2
(45) Date of Patent: Feb. 11, 2003

(54) GRADED COMPOSITE LAYER AND METHOD FOR FABRICATION THEREOF

(75) Inventor: Shih-Chi Lin, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 55 days.

(21) Appl. No.: 09/876,446

(22) Filed: Jun. 7, 2001

(65) Prior Publication Data

US 2002/0185711 A1 Dec. 12, 2002

(51) Int. Cl.⁷ .................................................. H01L 21/31
(52) U.S. Cl. ........................ 438/761; 438/763; 438/253
(58) Field of Search .................... 438/238, 240–241, 438/253–256, 381, 396–399, 699–702, 723–724, 761–763

(56) References Cited

U.S. PATENT DOCUMENTS

| | | | |
|---|---|---|---|
| 5,523,596 A | 6/1996 | Ohi et al. | |
| 5,616,401 A | 4/1997 | Kobayashi et al. | |
| 6,171,978 B1 | 1/2001 | Lin et al. | |
| 6,300,187 B2 * | 10/2001 | Smith | 238/239 |

* cited by examiner

Primary Examiner—Jey Tsai
(74) Attorney, Agent, or Firm—Tung & Associates

(57) ABSTRACT

Within both a fabrication and a method for fabricating the fabrication there is provided a second layer of a second material separated on one of its sides from a first layer of a first material by a first transition layer of a transition material. The second layer of the second material is also seperated on the other of its sides from a third layer of the first material by a second transition layer of the transition material. Within both the fabrication and the method for fabricating the fabrication, the transition material provides a continuous transition between the first material and the second material.

15 Claims, 2 Drawing Sheets

GRADED COMPOSITE LAYER AND METHOD FOR FABRICATION THEREOF

CROSS-REFERENCE TO RELATED APPLICATION

This application is related to co-assigned and co-invented application Ser. No. 09/203,959, now issued as U.S. Pat. No. 6,139,341, granted Oct. 31, 2000, titled "Universal Adapter Equipped With Retractable Pins", the teachings of which are incorporated herein fully by reference.

BACKGROUND OF THE INVENTION

1. Field of the Invention

The present invention relates generally to methods for fabricating microelectronic layers within microelectronic fabrications. More particularly, the present invention relates to methods for fabricating composite microelectronic layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, so also have performance demands which are placed upon microelectronic layers, and in particular upon microelectronic dielectric layers, that are employed for fabricating microelectronic fabrications.

In particular with respect to microelectronic dielectric layers that are employed as capacitor dielectric layers within capacitors within microelectronic fabrications, there has evolved a continuing need to fabricate such microelectronic dielectric layers with enhanced compositional integrity and enhanced compositional control within limited microelectronic dielectric layer thicknesses.

While capacitor dielectric layers within capacitors within microelectronic fabrications are desirably fabricated with enhanced compositional integrity and enhanced compositional control within limited microelectronic dielectric layer thicknesses, capacitor dielectric layers within capacitors within microelectronic fabrications are nonetheless not readily fabricated with enhanced compositional integrity and enhanced compositional control within limited microelectronic dielectric thicknesses within microelectronic fabrications insofar as capacitor dielectric layers within capacitors within microelectronic fabrications are often fabricated employing methods which do not provide optimal compositional integrity and optimal compositional control.

It is thus desirable in the art of microelectronic fabrication to provide methods and materials through which may be fabricated within microelectronic fabrications microelectronic dielectric layers with enhanced compositional integrity and enhanced compositional control.

It is towards the foregoing object that the present invention is directed.

Various microelectronic layers having desirable properties, and methods for fabrication thereof, have been disclosed in the art of microelectronic fabrication.

Included among the microelectronic layers and methods for fabrication thereof, but not limiting among the microelectronic layers and methods for fabrication thereof, are microelectronic layers and methods for fabrication thereof disclosed within: (1) Ohi et al., in U.S. Pat. No. 5,523,596 (a microelectronic capacitor dielectric layer and method for fabrication thereof comprising formed upon a first polysilicon capacitor plate a silicon oxynitride material having formed thereupon a silicon nitride material in turn having formed thereupon a silicon oxide material, such as to avoid over-oxidation of the first polysilicon capacitor plate when forming thereupon the microelectronic capacitor dielectric layer); (2) Kobayashi et al., in U.S. Pat. No. 5,616,401 (a microelectronic oxidation mask stress absorbing layer and method for fabrication thereof comprising an oxygen rich to nitrogen rich graded silicon oxynitride dielectric material formed such as to suppress a bird's beak extension when forming within a silicon semiconductor substrate an isolation region while employing a silicon nitride oxidation mask having formed thereunder the microelectronic oxidation mask stress absorbing layer); and (3) Lin et al., in U.S. Pat. No. 6,171,978 (a microelectronic capacitor dielectric layer and method for fabrication thereof comprising a continuously graded silicon oxide to silicon nitride dielectric material which provides for a variable dielectric constant within a controlled thickness within the microelectronic capacitor dielectric layer).

Desirable in the art of microelectronic fabrication are additional methods and materials which may be employed for forming within microelectronic fabrications dielectric layers with enhanced compositional integrity and with enhanced compositional control.

It is towards the foregoing object that the present invention is directed.

SUMMARY OF THE INVENTION

A first object of the present invention is to provide a microelectronic layer, and a method for fabricating the microelectronic layer.

A second object of the present invention is to provide the microelectronic layer and the method for fabricating the microelectronic layer in accord with the first object of the present invention, wherein the microelectronic layer is fabricated with enhanced compositional integrity and enhanced compositional control.

A third object of the present invention is to provide the microelectronic layer and the method for fabricating the microelectronic layer in accord with the first object of the present invention and the second object of the present invention, wherein the method for fabricating the microelectronic fabrication is readily commercially implemented.

In accord with the objects of the present invention, there is provided by the present invention a microelectronic layer and a method for fabricating the microelectronic layer.

To practice the method of the present invention, there is first provided a substrate. There is then formed over the substrate a first layer of a first material. There is then formed upon the first layer of the first material a first transition layer of a transition material. There is then formed upon the first transition layer of the transition material a second layer of a second material. There is then formed upon the second layer of the second material a second transition layer of the transition material. Finally, there is then formed upon the second transition layer of the transition material a third layer of the first material. Within the present invention, the transition material provides a continuous transition between the first material and the second material.

The method for fabricating the microelectronic layer in accord with the present invention contemplates the microelectronic layer fabricated in accord with the method for fabricating the microelectronic layer in accord with the present invention.

There is provided by the present invention a microelectronic layer, and a method for fabricating the microelectronic layer, wherein the microelectronic layer is fabricated with enhanced compositional integrity and enhanced compositional control.

The present invention realizes the foregoing object by fabricating the microelectronic layer as a multi-layer laminate having a central layer of a second material separated from a pair of surface (or interface) layers of a first material by a pair of transition layers of a transition material, where the transition material provides a continuous transition between the first material and the second material.

The method of the present invention is readily commercially implemented.

The present invention employs methods and materials as are otherwise generally known in the art of microelectronic fabrication, but employed within the context of specific process limitations to provide a microelectronic layer in accord with the present invention. Since it is thus at least in part a series of process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are disclosed in greater detail within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a microelectronic layer, and a method for fabricating the microelectronic layer, wherein the microelectronic layer is fabricated with enhanced compositional integrity and enhanced compositional control.

The present invention realizes the foregoing object by fabricating the microelectronic layer as a multi-layer laminate having a central layer of a second material separated from a pair of surface (or interface) layers of a first material by a pair of transition layers of a transition material, where the transition material provides a continuous transition between the first material and the second material.

Although the preferred embodiment of the present invention illustrates the present invention most particularly within the context of a graded layer having as its central portion a second layer formed of a silicon nitride material and having as a pair of its surface (or interface) portions a first layer and a third layer formed of a silicon oxide material or an oxygen rich silicon oxynitride material, the present invention is also intended to include a graded layer having as its central portion a second layer formed of a nitrogen rich silicon oxynitride material.

Similarly, although the present invention provides particular value within the context of forming graded dielectric layers for use within semiconductor integrated circuit microelectronic fabrications, the present may be employed for forming graded layers for use within fabrications including but not limited to microelectronic fabrications and optical control fabrications, where the microelectronic fabrications further include, but are not limited to, integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
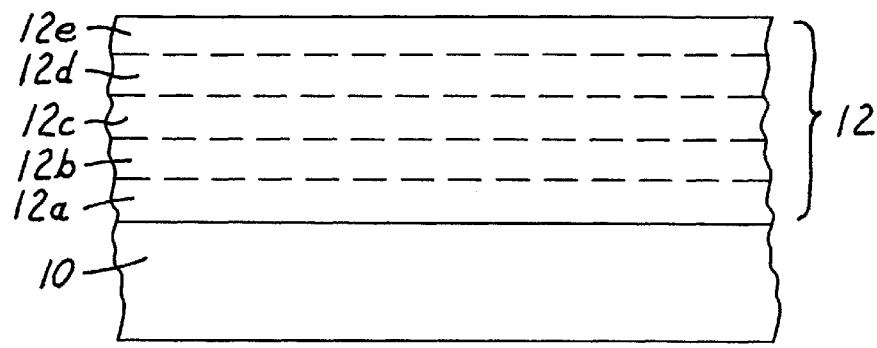
FIG. 1 shows a schematic cross-sectional diagram of a microelectronic fabrication having fabricated therein a graded layer in accord with a general preferred embodiment of the present invention.

Referring now to FIG. 1, there is shown a schematic cross-sectional diagram of a microelectronic fabrication having fabricated therein a graded layer in accord with a general embodiment of the present invention.

Shown in FIG. 1, in a first instance, is a substrate 10 upon which is fabricated, in a second instance, a graded layer 12.

Within the preferred embodiment of the present invention with respect to the substrate 10, and although, as above, the present invention provides particular value within the context of fabricating a semiconductor integrated circuit microelectronic fabrication, the substrate 10 may be a substrate employed within an optical fabrication, or a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, and although also not specifically illustrated within the schematic cross-sectional diagram of FIG. 1, the substrate 10 may consist of a substrate alone as employed within a microelectronic fabrication, or in an alternative, the substrate 10 may comprise a substrate as employed within the microelectronic fabrication, where the substrate has formed thereupon or thereover any of several additional microelectronic layers as are conventional within the microelectronic fabrication within which is employed the substrate. Such additional microelectronic layers may be selected from the group including but not limited to microelectronic conductor layers, microelectronic semiconductor layers and microelectronic dielectric layers.

Similarly, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the graded layer 12, and is more specifically illustrated within the schematic cross-sectional diagram of FIG. 1, the graded layer 12 comprises: (1) a first layer 12a formed upon the substrate 10, wherein within the present invention and the preferred embodiment of the present invention the first layer 12a is formed of a first material; (2) a first transition layer 12b formed upon the first layer 12a, wherein within the present invention and the preferred embodiment of the present invention the first transition layer 12b is formed of a transition material; (3) a second layer 12c formed upon the first transition layer 12b, wherein within the present invention and the preferred embodiment of the present invention the second layer is formed of a second material; (4) a second transition layer 12d formed upon the second layer 12c, wherein within the present invention and the preferred embodiment of the present invention the second transition layer 12d is formed of the transition material; and (5) a third layer 12e formed upon the second transition layer 12d, wherein within the present invention and the preferred embodiment of the present invention, the third layer 12e is formed of the first material.

Within the present invention and preferred embodiment of the present invention, and although other materials are not precluded in a most general sense within the present invention for forming a graded layer in accord with the present invention, typically and preferably, the first layer 12a of the first material and the third layer 12e of the first material are typically and preferably formed from a first material selected from the group including but not limited to silicon oxide materials and oxygen rich silicon oxynitride materials (having an oxygen:nitrogen atomic ratio preferably from about 1:0 to about 1:1). Similarly, within the present invention and the preferred embodiment of the present invention, the second layer 12c of the second material is typically and preferably formed of a second material selected from the group including but not limited to silicon nitride materials.

Within the preferred embodiment of the present invention with respect to the first transition layer 12b and the second transition layer 12d, each formed of the transition material, the first transition layer 12b and the second transition layer 12d are each typically and preferably formed of a material composition which is graded from: (1) the first material from which is formed the first layer 12a or the third layer 12e; to (2) the second material from which is formed the second layer 12c. Thus, within the present invention and the preferred embodiment of the present invention, each of the pair of the first transition layer 12b and the second transition layer 12d is symmetrically graded from the second material composition of the second layer 12c to the first material composition of the first layer 12a and the first material composition of the third layer 12e.

Although the schematic cross-sectional diagram of FIG. 1 illustrates within the graded layer 12 each of the first layer 12a, the first transition layer 12b, the second layer 12c, the second transition layer 12d and the third layer 12e as formed with nominally equivalent thicknesses, such is not required within the present invention. Similarly, it is also not required within the present invention that specific sub-sets within the foregoing series of five layers be formed with equivalent thicknesses.

Typically and preferably: (1) each of the first layer 12a and the third layer 12e is independently formed to a thickness of from about 0 to about 10 angstroms; (2) each of the first transition layer 12b and the second transition layer 12d is independently formed to a thickness from about 5 to about 10 angstroms; and (3) the second layer 12c is independently formed to a thickness of from about 30 to about 40 angstroms.

Within the preferred embodiment of the present invention, each of the series of layers 12a, 12b, 12c, 12d and 12e which comprises the graded layer 12 may be formed employing methods as are conventional in the art of microelectronic fabrication, provided that the methods in turn allow for the graded materials compositions of the first transition layer 12b and the second transition layer 12d, as noted above. Typically and preferably, each of the series of layers 12a, 12b, 12c, 12d and 12e is formed employing a continuous single chemical vapor deposition (CVD) method employing a single silicon source material, a single oxygen source material and a single nitrogen source material, while further employing a constant or relatively constant silicon source material flow rate, and inversely varying an oxygen source material flow rate and a nitrogen source material flow rate.

Within the present invention and the preferred embodiment of the present invention, the silicon source material may be selected from the group including but not limited to silane, disilane, chlorosilanes, and chlorodisilanes, with silane particularly preferred. Similarly, within the present invention and the preferred embodiment of the present invention, the oxygen source material may be selected from the group including but not limited to oxygen, ozone, nitrous oxide and nitric oxide, with nitrous oxide particularly preferred. Finally, within the present invention and the preferred embodiment of the present invention, the nitrogen source material may be selected from the group including but not limited to ammonia and hydrazine, with ammonia particularly preferred.

Typically and preferably the continuous single chemical vapor deposition (CVD) method also employs: (1) a reactor chamber pressure of from about 0.25 to about 0.4 torr; (2) a substrate 10 temperature of from about 750 to about 850 degrees centigrade; (3) a silane silicon source material flow rate of from about 40 to about 60 standard cubic centimeters per minute (sccm); (4) a nitrous oxide oxygen source material flow rate varying from an upper value of from about 380 to about 420 standard cubic centimeters per minute (sccm) to a lower value of up to about 0 standard cubic centimeters per minute (sccm); and (5) an ammonia nitrogen source material flow rate varying from a lower value of up to about 0 standard cubic centimeters per minute (sccm) to an upper value of from about 380 to about 420 standard cubic centimeters per minute (sccm).

Figure 2:
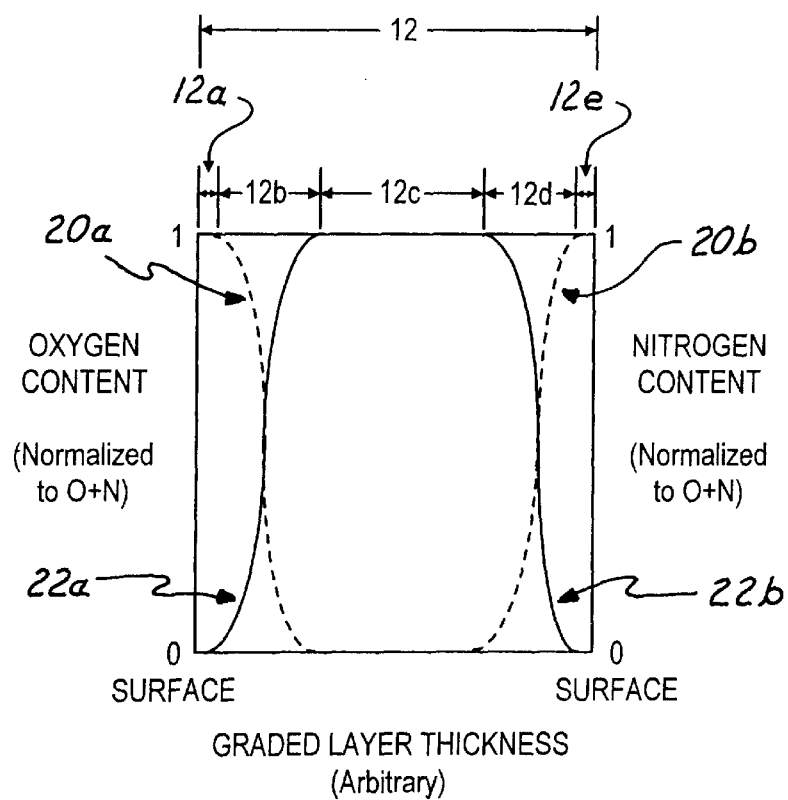
FIG. 2 and FIG. 3 show a pair of graphs of Oxygen Content and Nitrogen Content versus Graded Layer Thickness for a pair of more specific graded layers fabricated in accord with the general preferred embodiment of the present invention.
Figure 3:
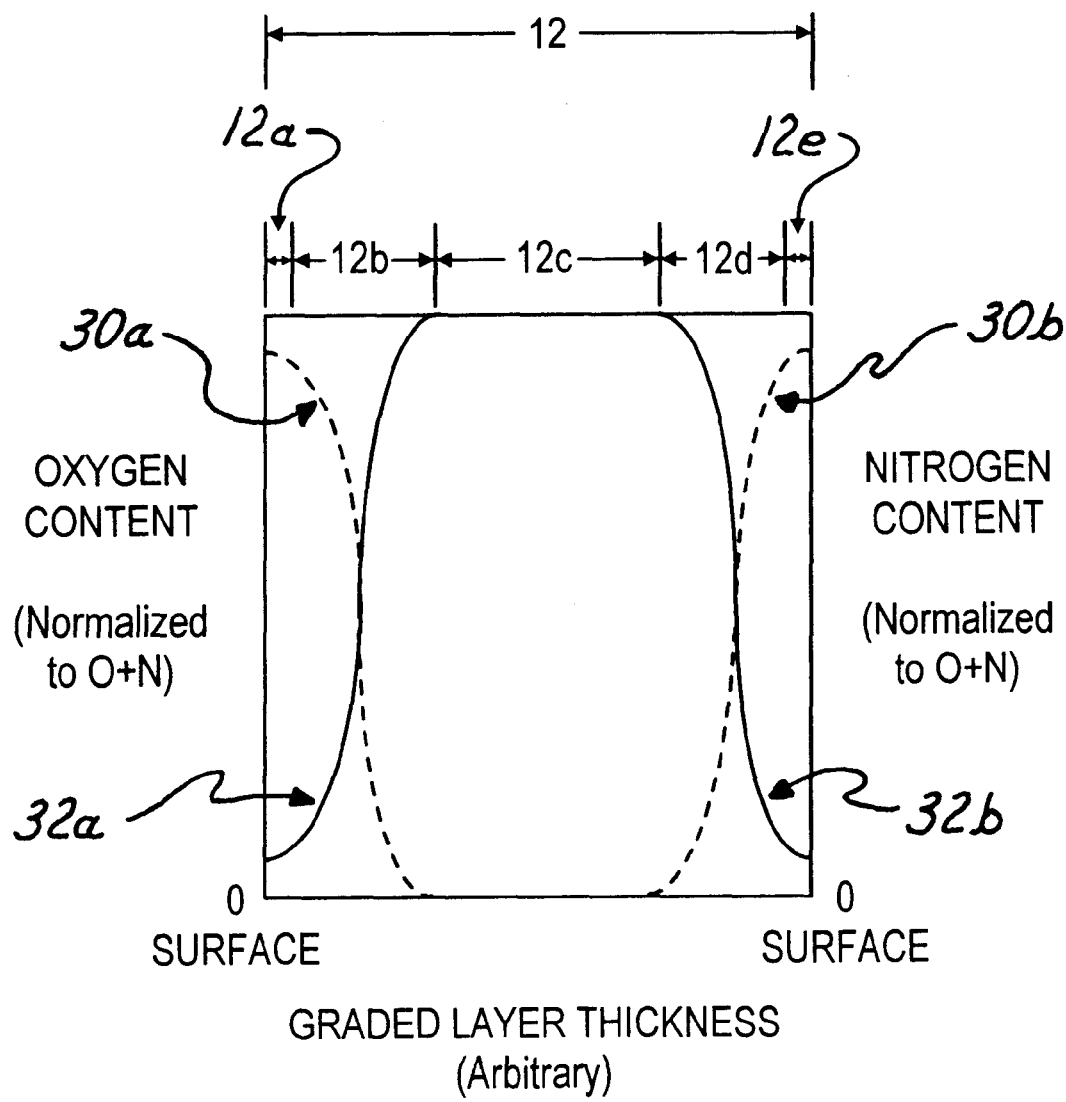

Referring now to FIG. 2 and FIG. 3, there is shown a pair of graphs of Oxygen Content and Nitrogen Content versus Graded Layer Thickness for a more specific pair of symmetrically graded layers fabricated in accord with the preferred embodiment of the present invention.

As is illustrated more particularly within the graph of FIG. 2, wherein the curves which correspond with reference numerals 20a and 20b correspond with normalized oxygen content and the curves which correspond with reference numerals 22a and 22b correspond with normalized nitrogen content, the symmetrically graded layer 12 comprises a first layer 12a of a silicon oxide material and a third layer 12e of the silicon oxide material, where the first layer 12a of the silicon oxide material and the third layer 12e of the silicon oxide material are separated from a second layer 12c of a silicon nitride material by a corresponding first transition layer 12b of a silicon oxynitride transition material and a second transition layer 12d of the silicon oxynitride transition material, wherein the silicon oxynitride transition material comprises a silicon oxynitride material whose composition continuously progresses from a comparatively oxygen rich silicon oxynitride material to a comparatively nitrogen rich silicon oxynitride material, or the reverse, as appropriate.

As is illustrated within the graph of FIG. 3, wherein the curves which correspond with reference numerals 30a and 30b correspond with normalized oxygen content and the curves which correspond with reference numerals 32a and 32b correspond with normalized nitrogen content, there is formed a symmetrically graded dielectric layer where the first layer 12a of the first material and the second layer 12e of the first material are formed of a comparatively oxygen rich silicon oxynitride material, rather than a silicon oxide material as illustrated within the graph of FIG. 2.

As is understood by a person skilled in the art, although: (1) the graph of FIG. 2 illustrates a symmetrically graded layer 12 formed of silicon oxide material graded to a silicon nitride material in turn graded to the silicon oxide material; and (2) the graph of FIG. 3 illustrates a symmetrically graded layer formed of an oxygen rich silicon oxide material graded to a silicon nitride material in turn graded to the oxygen rich silicon nitride material, as noted above, neither the present invention nor the preferred embodiment of the present invention is limited to the materials combinations as disclosed within the graphs of FIG. 2 and FIG. 3. In that regard, and as is understood by a person skilled in the art, the present invention may also comprise: (1) a silicon oxide material graded to a comparatively nitrogen rich silicon oxynitride material in turn graded back to the silicon oxide material; as well as (2) a comparatively oxygen rich silicon oxynitride graded to a comparatively nitrogen rich silicon oxynitride material in turn graded back to the comparatively oxygen rich silicon oxynitride material.

With respect to applications of the graded layers of the present invention, they may be employed as layers including but not limited to capacitor dielectric layers within microelectronic fabrications, blanket or patterned hard mask layers within microelectronic fabrications and optical control layers within fabrications including but not limited to microelectronic fabrications and optical fabrications.

When employed as a capacitor dielectric layer within a capacitor within a microelectronic fabrication, a graded layer in accord with the present invention provides, within a range determined by a dielectric constant of a first dielectric material and a dielectric constant of a second dielectric material in accord with the present invention, for a tunable dielectric constant of the capacitor dielectric layer while maintaining a constant thickness of the capacitor dielectric layer. Similarly, when employed as a blanket hard mask layer from which may be formed a patterned hard mask layer within a microelectronic fabrication, due to the presence of a silicon oxide surface layer or an oxygen rich silicon oxynitride surface layer rather than a silicon nitride surface layer or a nitrogen rich silicon oxynitride surface layer, the patterned hard mask layer may be formed with an inhibited scavenging of a photoacid generated catalyst which is formed incident to photoexposure of a blanket photoresist material from which is formed a patterned photoresist layer which may be employed as a photoresist mask for forming from the blanket hard mask layer the patterned hard mask layer. Under such circumstances, the patterned photoresist layer, and the resulting patterned hard mask layer, are formed with enhanced linewidth control. Finally, and under circumstances where the graded layer is employed within optical control applications within a microelectronic fabrication or an optical fabrication, the reflective characteristics of the graded layer may be modified by materials composition and thickness selection of the various layers which comprise the graded layer.

Upon fabricating the graded layer 12 in accord with the schematic cross-sectional diagram of FIG. 1 and the graphs of FIG. 2 and FIG. 3, there is provided in accord with the present invention a microelectronic layer, and a method for fabricating the microelectronic layer, wherein the microelectronic layer is fabricated with enhanced compositional integrity and enhanced compositional control.

The present invention realizes the foregoing object by fabricating the microelectronic layer as a multi-layer laminate having a central layer of a second material separated from a pair of surface (or interface) layers of a first material by a pair of transition layers of a transition material, where the transition material provides a continuous transition between the first material and the second material.

As is understood by a person skilled in the art, the preferred embodiment of the present invention is illustrative of the present invention rather than limiting of the present invention. Revisions and modifications may be made to methods, materials, structures and dimensions which may be employed for fabricating a graded layer in accord with the preferred embodiment of the present invention, while still providing a graded layer in accord with the present invention, and a method for fabrication thereof, further in accord with the accompanying claims.

What is claimed is:

1. A method for fabricating a microelectronic layer comprising:

providing a substrate;

forming over the substrate a first layer of a first material;

forming upon the first layer of the first material a first transition layer of a transition material;

forming upon the first transition layer of the transition material a second layer of a second material;

forming upon the second layer of the second material a second transition layer of the transition material; and forming upon the second transition layer of the transition material a third layer of the first material, where the transition material provides a continuous transition between the first material and the second material.

2. The method of claim 1 wherein the substrate is employed within a fabrication selected from the group consisting of microelectronic fabrications and optical fabrications.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein:

the first material is selected from the group consisting of silicon oxide materials and oxygen rich silicon oxynitride materials;

the second material is selected from the group consisting of nitrogen rich silicon oxynitride materials and silicon nitride materials; and the transition material is a silicon oxynitride material.

5. The method of claim 4 wherein the first material, the second material and the transition material are formed employing a single continuous chemical vapor deposition (CVD) method employing a silicon source material, an oxygen source material and a nitrogen source material with an inversely varied oxygen source material flow rate and nitrogen source material flow rate.

6. The method of claim 1 wherein:

the first material is a silicon oxide material;

the second material is a silicon nitride material; and the transition material is a silicon oxynitride material.

7. The method of claim 6 wherein the first material, the second material and the transition material are formed employing a single continuous chemical vapor deposition (CVD) method employing a silicon source material, an oxygen source material and a nitrogen source material with an inversely varied oxygen source material flow rate and nitrogen source material flow rate.

8. The method of claim 1 wherein:
   the first material is an oxygen rich silicon oxynitride material;
   the second material is a silicon nitride material; and
   the transition material is a silicon oxynitride material.

9. The method of claim 8 wherein the first material, the second material and the transition material are formed employing a single continuous chemical vapor deposition (CVD) method employing a silicon source material, an oxygen source material and a nitrogen source material with an inversely varied oxygen source material flow rate and nitrogen source material flow rate.

10. A fabrication comprising:
    a substrate;
    a first layer of a first material formed over the substrate;
    a first transition layer of a transition material formed upon the first layer of the first material;
    a second layer of a second material formed upon the first transition layer of the transition material;
    a second transition layer of the transition material formed upon the second layer of the second material; and
    a third layer of the first material formed upon the second transition layer of the transition material, where the transition material provides a continuous transition between the first material and the second material.

11. The fabrication of claim 10 wherein the substrate is employed within a fabrication selected from the group consisting of microelectronic fabrications and optical fabrications.

12. The fabrication of claim 10 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

13. The fabrication of claim 10 wherein:
    the first material is selected from the group consisting of silicon oxide materials and oxygen rich silicon oxynitride materials;
    the second material is selected from the group consisting of nitrogen rich silicon oxynitride materials and silicon nitride materials; and
    the transition material is a silicon oxynitride material.

14. The fabrication of claim 10 wherein:
    the first material is a silicon oxide material;
    the second material is a silicon nitride material; and
    the transition material is a silicon oxynitride material.

15. The fabrication of claim 10 wherein:
    the first material is an oxygen rich silicon oxynitride material;
    the second material is a silicon nitride material; and
    the transition material is a silicon oxynitride material.

* * * * *